United States Patent [19]

Motoyama et al.

[11] 4,417,135

[45] Nov. 22, 1983

[54] POWER SAVING ELECTRONIC COUNTER CIRCUIT FOR TAPE RECORDER

[75] Inventors: Kazuyasu Motoyama; Kenzi Furuta; Katsumi Kanayama, all of Hachioji, Japan

[73] Assignee: Olympus Optical Co., Ltd., Tokyo, Japan

[21] Appl. No.: 148,526

[22] Filed: May 9, 1980

[30] Foreign Application Priority Data

May 28, 1979 [JP] Japan .................. 54-6583879
May 28, 1979 [JP] Japan .................. 54-7149479[U]

[51] Int. Cl.$^3$ .................. G11B 27/34; H03K 21/30
[52] U.S. Cl. .................. 377/18; 377/112; 377/24; 364/707; 360/71
[58] Field of Search .................. 360/137; 364/705, 707; 340/377; 235/92 NT, 92 EA, 92 EV

[56] References Cited

U.S. PATENT DOCUMENTS

| 3,941,989 | 3/1976 | McLaughlin et al. | 364/707 |
| 3,955,185 | 5/1976 | Nishimura | 340/377 X |
| 3,955,355 | 5/1976 | Luce | 364/707 |
| 4,322,765 | 3/1982 | Furuta | 360/137 |

FOREIGN PATENT DOCUMENTS

| 5097873 | 2/1977 | Japan | 364/707 |
| 50129447 | 4/1977 | Japan | 364/707 |
| 54-152919 | 12/1979 | Japan | 364/707 |

OTHER PUBLICATIONS

Foster: IBM Technical Disclosure Bulletin, Battery Powered Data Entry Unit, vol. 15, No. 11, Apr. 1973, pp. 3437/3438.

*Primary Examiner*—Felix D. Gruber
*Attorney, Agent, or Firm*—Frishauf, Holtz, Goodman & Woodward

[57] ABSTRACT

In a tape recorder including a circuit for generating pulses according to the running of a tape, an electronic counter circuit is provided which includes a counter for counting pulses and a display section for displaying its count value. The electronic counter circuit further includes a control circuit for disconnecting a display section from a power supply source a predetermined time period after the running of the tape is stopped and a memory for storing the count value at all times.

9 Claims, 10 Drawing Figures

POWER SAVING ELECTRONIC COUNTER CIRCUIT FOR TAPE RECORDER

BACKGROUND OF THE INVENTION

This invention relates to a tape running position counter using an electronic counter circuit for use in a tape recorder etc.

Generally, a tape recorder includes a tape counter showing an amount of running of a tape. In the prior art a mechanical counter is mainly used whose digit wheels are rotated in interlock with the rotation of a reel shaft to display a count value corresponding to the amount of running of the tape. Recently an electronic counter circuit is used which counts pulses generated according to the rotation of the reel shaft and displays a corresponding count value. The electronic counter circuit can effect various controls using the count value. When, for example, the tape is run to a predetermined count value in the fast forward or rewind mode, the running of the tape can be automatically stopped. Since in the electronic counter circuit a display section consumes great power it is desired that the electronic counter circuit be disconnected from a power supply at the stop mode time. In the case where, for example, switching is effected from a playback mode to a rewind mode the running of the tape is temporarily stopped and the counter is reset, causing a count value on a display section to disappear. In this case, a count value corresponds to an amount of running of the tape as measured from a position taken by the tape at each stopping time and it is impossible to obtain a count value corresponding to an absolute amount of running of the tape as measured from an initial state in which a tape is fully wound on one reel shaft. One solution to this problem is to provide a display switch separately from an operation switch of the tape recorder to control a supply of power from a power supply to a display section. However, this approach leads to a complicated arrangement and, moreover, there is a risk that a count value on the display section will be erased by a possible erroneous operation of the switch.

SUMMARY OF THE INVENTION

It is accordingly an object of this invention to provide a tape running position counter including an electronic counter for counting pulses generated from a pulse generator which is energized in response to a supply of a power supply voltage, in which a count value cannot be reset even if the energization of the pulse generator is stopped and the display of the count value continues for a predetermined time.

SUMMARY OF THE INVENTION

In accordance with the present invention, a tape recorder comprises an electronic device for displaying a tape running position of the tape in the tape recorder, which device comprises means for generating pulses as a function of the rotation of a tape running means; electronic counter means for counting pulses of the output signal of the pulse generating means; display means for displaying the count value of the counter means; signal producing means for producing a signal for a predetermined period of time upon detecting that the tape recorder is set in a non-operating mode; and power switching means coupled to the signal producing means for stopping power supply from a power source at least to the display means in response to the termination of the output signal from the signal producing means at the end of the predetermined period of time.

DETAILED DESCRIPTION OF THE PREFERRED EMBODIMENT

An electronic counter circuit of this invention as applied to a tape recorder will be explained below by referring to the accompanying drawings.

Figure 1:
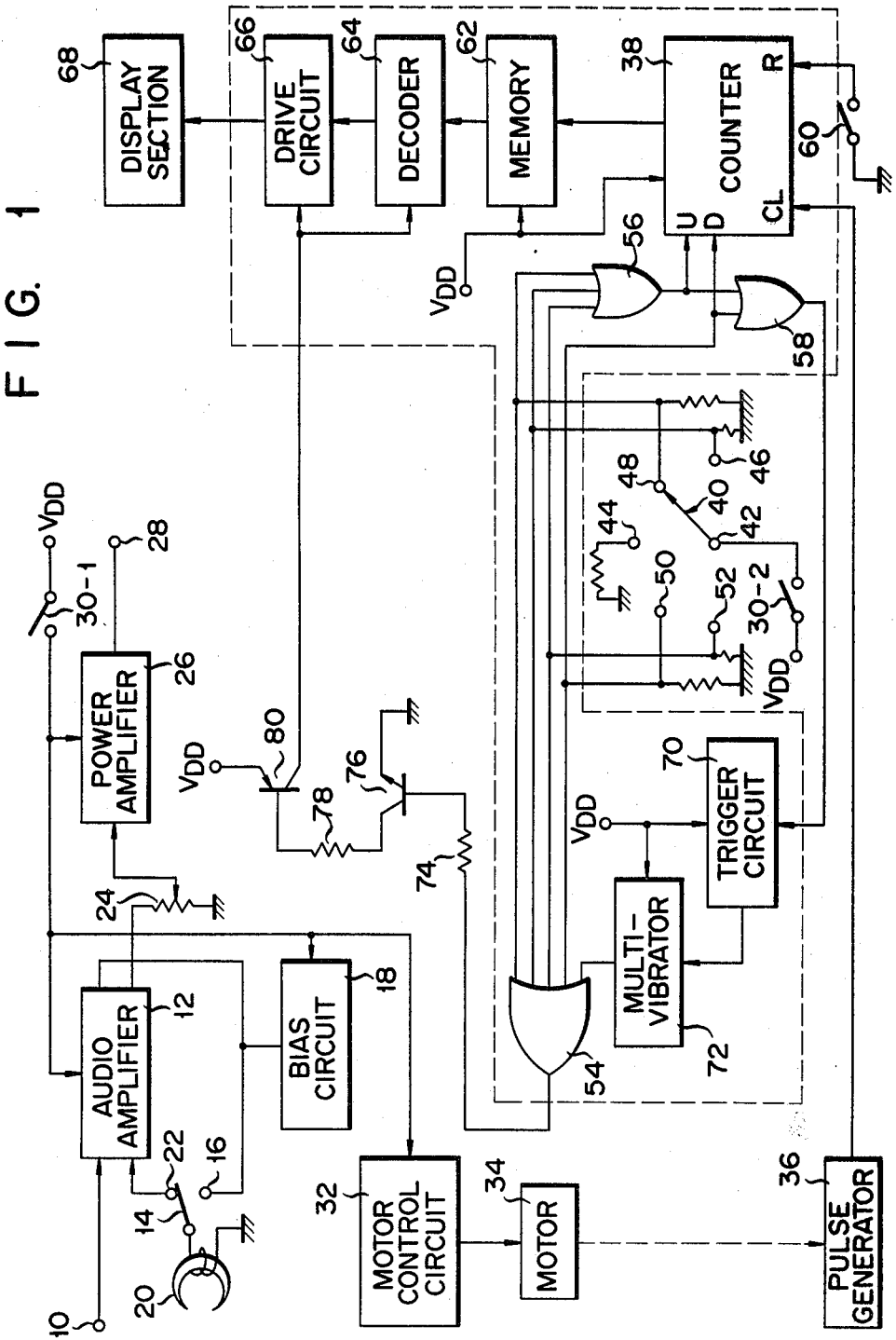
FIG. 1 is a circuit diagram showing an electronic counter circuit arrangement for a tape recorder according to one embodiment of this invention.

In FIG. 1 an input terminal 10 is connected to a "record side" terminal 16 of a record/playback changeover switch 14 through an audio amplifier 12. A sound signal from a microphone or tuner, not shown, is supplied to the input terminal 10. The output signal of a bias circuit 18 is also supplied to the "record side" terminal 16 of a record/playback changeover switch 14. A fixed contact of the changeover switch 14 is connected to a magnetic head 20 and a "playback side" terminal 22 of the changeover switch 14 is connected to a potentiometer 24 through the audio amplifier 12. The magnetic head 20 is contacted with a tape according to the actuation of an operation button of a tape recorder not shown. The output signal of the potentiometer 24 is supplied to an output terminal 28 through a power amplifier 26. A signal on the output terminal 28 is translated by a speaker not shown to a sound. A power supply terminal $V_{DD}$ for applying DC voltage is connected to the audio amplifier 12, power amplifier 26, bias circuit 18 and a motor control circuit 32 through a switch 30-1. The motor control circuit 32 supplies to a motor 34 of a tape recorder a control signal indicative of its rotation speed and rotation direction determined by a choice of operation buttons not shown. A pulse generator 36 is energized in response to the rotation of a reel shaft and the output signal of the pulse generator 36 is supplied to a clock input terminal CL of an up/down counter 38. For example, a reed switch serves as the pulse generator 36. A disk having permanent magnets around the periphery thereof is mounted on a reel shaft of the tape recorder. If the reed switch is disposed in the vicinity of the reel shaft, then it is opened and closed by the rotation of the reel shaft to produce pulses. Alternatively, it is also possible to provide a light reflecting section on the portion of the outer periphery of the reel shaft and dispose a light emitting element and light receiving element in combination with the light reflecting section to optically produce pulses. It will be sufficient if the pulse generator 36 produces pulses according to the rotation of the reel shaft, i.e. the running of the tape.

A mode switch 40 is switched in interlock with the operation button not shown of the tape recorder to control the switching of the above-mentioned record/playback changeover switch 14, the contact of the magnetic head 20 with the tape and the selection of an output control signal from the motor control circuit 32. The mode switch 40 has 5 movable contacts 44, 46, 48, 50 and 52 for stopping, recording, reproducing, rewinding and fast forwarding, respectively. The power supply terminal $V_{DD}$ is connected to a fixed contact 42 of the switch 40 through a switch 30-2. The stop terminal 44 of the mode switch 40 is grounded and the record terminal 46, playback terminal 48, rewind terminal 50 and fast forward terminal 52 of the switch 40 is connected to the corresponding input terminals of an OR gate 54. The record terminal 46, playback terminal 48 and fast forward terminal 52 of the switch 40 are also connected to the corresponding input terminals of an OR gate 56, and the rewind terminal 50 of the switch 40 is connected to a down count terminal D of the up-/down counter 38 and one input terminal of an OR gate 58. The output terminal of the OR gate 56 is connected to the up count terminal U of the counter 38 and the other input terminal of the OR gate 58. A reset terminal R of the counter 38 is grounded through a switch 60. A count output of the counter 38 is supplied to a memory 62 and the output of the memory 62 is supplied to a display section 68 through a decoder 64 and drive circuit 66. The decoder 64 converts a binary output of the counter 38 to a signal for display. The power supply terminal $V_{DD}$ is connected to the counter 38 and memory 62. The output of the OR gate 58 is supplied to a trigger circuit 70. The output of the trigger circuit 70 is supplied to a monostable multivibrator 72 and the power supply terminal $V_{DD}$ is connected to the multivibrator 72 and trigger circuit 70. The output of the multivibrator 72 is supplied to the corresponding input terminal of the OR gate 54 and the output of the OR gate 54 is connected to the base of an NPN type transistor 76 through a resistor 74. The transistor 76 has its emitter grounded and its collector connected to the base of a PNP type transistor 80 through a resistor 78. The power supply terminal $V_{DD}$ is connected to the emitter of the transistor 80. The collector of the transistor 80 is connected to the decoder 64 and drive circuit 66. That portion enclosed by a broken line in FIG. 1 shows an IC portion. The switches 30-1 and 30-2 are operated in interlock with the mode switch 40 and adapted to be opened only when the movable contact of the switch 40 is switched to the stop terminal 44 and closed when the movable contact of the switch 40 is switched to the other terminals thereof.

The operation of the above-mentioned embodiment will be explained below by referring to FIGS. 2A to 2H.

Figure 2:
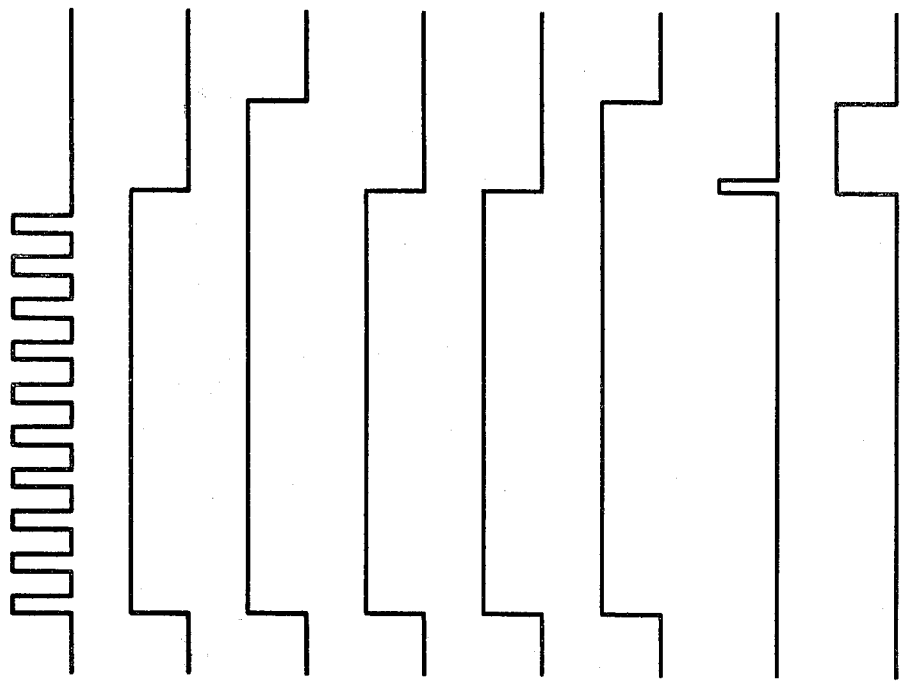
FIGS. 2A to 2H show a time chart for explaining the operation of the electronic counter circuit of this invention.

FIGS. 2A to 2H are a time chart showing the signal waveforms of the respective portions of FIG. 1. Suppose that the tape recorder is in the stop mode with a DC voltage applied to the power supply terminal $V_{DD}$, that is, the switch 30-1 and 30-2 are opened with the movable contact of the switch 40 at the stop terminal 44 side. In this case, the signals of the respective sections of the embodiment are all at low levels. When the playback button is depressed the movable contact of the switch 40 is switched to the playback terminal 48 and the switches 30-1 and 30-2 connected to the power supply terminal $V_{DD}$ are closed to supply a power supply voltage to the corresponding sections. The movable contact of the record/playback changeover switch 14 is connected to the playback terminal 22 according to the switching of the mode switch 40 and the magnetic head 20 is contacted with the magnetic tape. Since the power supply voltage is supplied, the motor control circuit 32 is energized to supply a control signal for setting a playback mode to the motor 34. As a result, the motor 34 is rotated and a signal recorded on the tape is detected by the magnetic head 20 and reproduced at a speaker through the audio amplifier 12 and power amplifier 26. A pulse signal as shown in FIG. 2A is supplied, according to the rotation of the reel shaft, from the pulse generator to the clock input terminal CL of the counter 38. Since an output signal from the playback terminal 48 of the mode switch 40 becomes a high level as shown in FIG. 2B the output signals from the OR gates 54 and 56 become high levels as shown in FIGS. 2C and 2D. Because the output signal from the OR gate 56 is supplied to the up count terminal U of the counter 38 and the input terminal of the OR gate 58, the counter 38 starts an up count operation and the output signal from the OR gate 58 becomes a high level as shown in FIG. 2E. The count value of the counter 38 shows a value corresponding to an amount of running of the tape, which in turn is stored in the memory 62. The transistors 76 and 80 are rendered conductive by the output signal of the OR gate 54, and the collector signal of the transistor 80 becomes a high level as shown in FIG. 2F. The decoder 64 and drive circuit 66 are energized by the collector signal to permit the contents of the memory 62 to be displayed in the display section 68.

When the movable contact of the mode switch 40 is switched to the stop terminal 44 the switches 30-1 and 30-2 are opened. Since the rotation of the motor 34 is stopped, the occurrence of a pulse signal is stopped as shown in FIG. 2A. An output signal from the playback terminal 48 of the mode switch 40 becomes a low level as shown in FIG. 2B and thus an output signal from the OR gate 56 and an output signal from the OR gate 58 become low levels as shown in FIGS. 2D and 2E.

Since the trigger circuit 70 and multivibrator 72 are connected directly to the power supply terminal $V_{DD}$ they are energized even if the tape recorder is at the stop mode. The trigger circuit 70 detects the fall of the output signal of the OR gate 58 and supplies a pulse as shown in FIG. 2G to the multivibrator 72. According to this pulse the multivibrator 72 produces a high level signal, as shown in FIG. 2H, for a predetermined time. For this reason, even after the signal from the mode switch 40 becomes a low level, the output signal of the OR gate 54 is maintained at a high level, as shown in FIG. 2C, for a predetermined time by a signal from the multivibrator 72. This causes the ON states of the transistors 76 and 80 to be continued, permitting the collector signal of the transistor 80 to be maintained at the high level as shown in FIG. 2F. For this reason, even if the tape recorder is set to a stop mode the count value on the display section 68 is not immediately erased and it is automatically erased after a predetermined time period. Since the count value is stored in the memory 62, the counter 38 counts the pulses, after the restart of the tape recorder, from that count value taken at the stopping time, the count value corresponds to an absolute amount of running of the tape. It is to be noted here that since the counter 38 and memory 62 are smaller in power consumption than the drive circuit 66 and decoder 64 it is possible to supply a power supply voltage at all times to the counter 38 and memory 62. Though this invention has been explained in connection with the playback mode the same control operation is effected in the case of the other operation modes, except that during the rewind mode a signal on the down count terminal D of the counter 38 becomes a high level and counter 38 is counted down. Where the contents of the counter is desired to be reset as in the case of the replacement of the tape etc., it is only necessary to close the switch 60. According to this embodiment the count value taken at the stop mode is stored in the memory with a slight power consumption.

Figure 3:
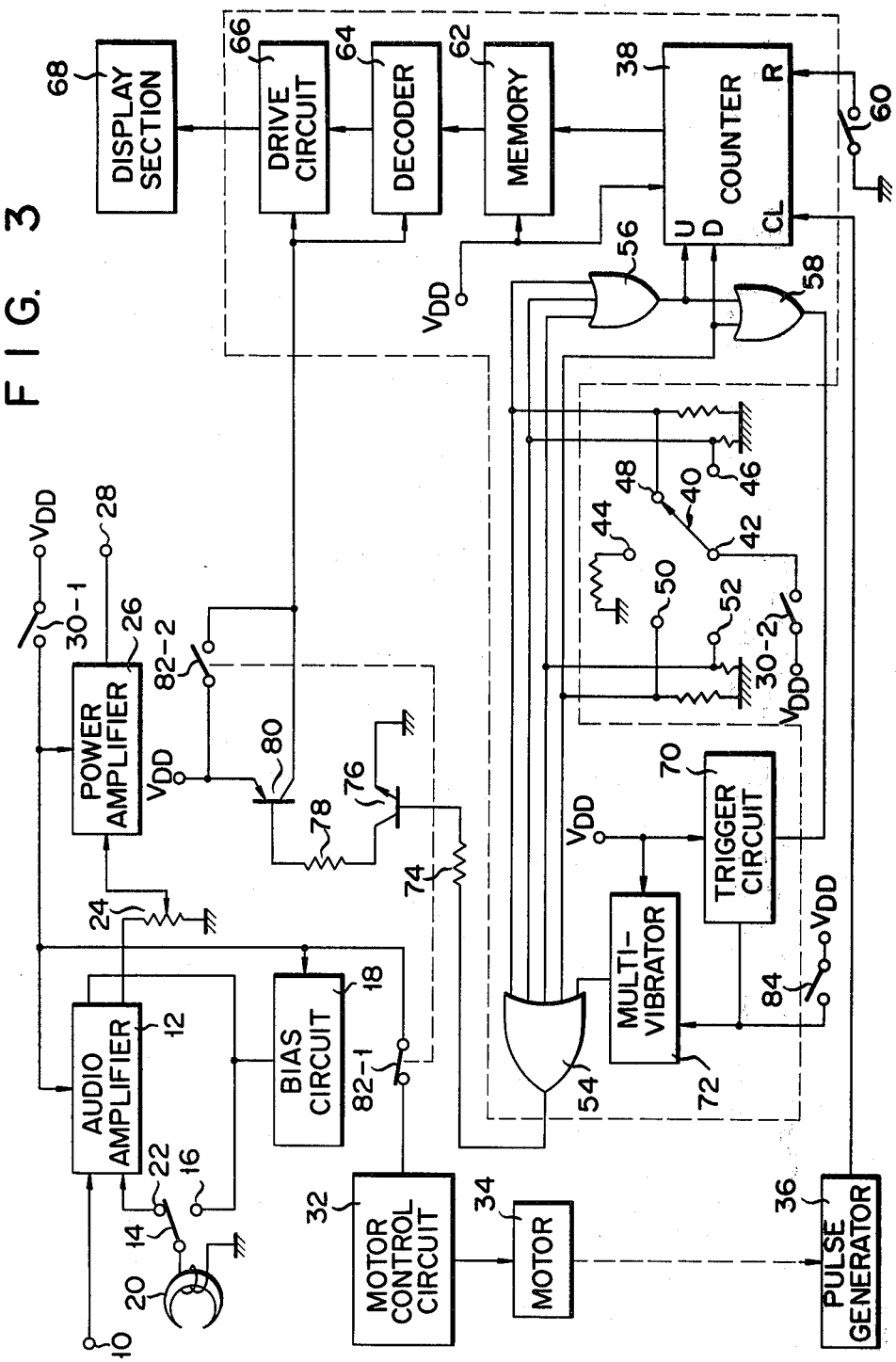
FIG. 3 is a circuit diagram showing an electronic counter circuit for a tape recorder according to another embodiment of this invention.

FIG. 3 shows a second embodiment of this invention. In this embodiment, like reference numerals are employed to designate like parts or elements corresponding to those shown in FIG. 1 and further explanation is omitted for brevity's sake. In this embodiment a power supply terminal $V_{DD}$ is connected through a switch 30-1 and a normally closed pause switch 82-1 to a motor control circuit 32. The pause switch 82-1 is opened only during the time in which a pause button for temporary stopping is depressed, causing the energization of the motor control circuit 32 to be temporarily stopped. When the pause switch 82-1 is closed it continues the energization of the motor control circuit 32. The power supply terminal $V_{DD}$ is connected to the collector of a transistor 80 through a normally open switch 82-2 which is operated in interlock with the pause switch 82-1. The pause switch 82-2 is closed when the pause switch 82-1 is opened. The power supply terminal $V_{DD}$ is connected to a monostable multivibrator 72 through a switch 84 which is closed in interlock with a display button not shown.

In this embodiment, the same operation as in the first embodiment is effected in the case where the tape recorder is switched from the operation mode to the stop mode. Where, the stop mode being taken and display being erased a predetermined time thereafter, a count value at the stop mode is desired to be displayed, it is only necessary that the switch 84 be closed by depressing the display button. By doing so, the monostable multivibrator 72 again delivers a high level signal for a predetermined time, causing transistors 76 and 80 to be rendered conductive to permit the contents of memory 62 to be displayed, for a predetermined time, on a display section 68. Since at this time the motor 34 is not rotated and thus the tape is not run, it is possible to display a position where the tape is stopped. Where it is desired to temporarily stop the running of the tape it is only necessary that the pause switch 82-1 be opened by depressing the pause button. Since at this time the switch 82-2 is closed in interlock with the pause switch 82-1, a drive circuit 66 and decoder 64 are connected directly to the power supply terminal $V_{DD}$ to permit the display of the count value to be continued. For this reason, at the temporary stopping of running of the tape the count value can be displayed without dependence on a signal from the multivibrator 72. That is, during the temporary stopping of the tape recorder it is possible to display a count value by the operation of pause button which is stored in the memory 62. This invention can be applied not only to a tape recorder, but also to a video tape recorder, etc.

What we claim is:

1. In a tape recorder having a rotatable tape running means, mode setting means coupled to said tape running means for setting an operation mode of the tape recorder, and a source of electrical power, a device for displaying a tape running position of the tape in the tape recorder, comprising:
   means coupled to said tape running means and to said power source for generating pulses as a function of the rotation of said tape running means;
   electronic counter means coupled to said pulse generating means and to said power source for counting pulses of the output signal of said pulse generating means;
   display means coupled to said counter means and to said power source for displaying the count value of said counter means;
   signal producing means coupled to said mode setting means and to said power source for producing a signal for a predetermined period of time upon detecting that the tape recorder is set in a non-operating mode; and
   power switching means coupled to said signal producing means for stopping power supply from said power source at least to said display means in response to the termination of the output signal from said signal producing means at the end of said predetermined period of time.

2. The device of claim 1, wherein said signal producing means includes a monostable multivibrator for producing said signal for said predetermined period of time upon triggering of the monostable multivibrator; and a trigger circuit coupled to said monostable multivibrator for triggering said monostable multivibrator when the tape recorder is set in a non-operating mode.

3. The device of claim 2, wherein said signal producing means further includes a trigger switch for triggering said monostable multivibrator upon closure thereof to cause power to be supplied to said display means.

4. The device of claim 1, further comprising two interlocked switches, one of said switches being coupled to said tape running means and operable to selectively stop power supply to said tape running means to stop said tape running means; and the other of said two switches arranged to couple said power source to said display means when said one switch is operated, independent of said power switching means.

5. The device of claim 4, wherein said two interlocked switches comprise a pause control for said tape recorder.

6. The device of claim 1, wherein said counter means is continuously supplied with power from said power source when said tape recorder is on, independent of said power switching means.

7. The device of claim 6, wherein said counter means comprises a counter responsive to said pulse signal and a memory means coupled to the output of said counter for storing the count of said counter, said memory means being coupled to said display means, said counter and said memory means being continuously supplied with power from said power source when said tape recorder is on, independent of said power switching means.

8. The device of claim 1, wherein said display means comprises:
   a decoder coupled to said counter means for decoding data supplied from said counter means into data for display;
   a display element; and
   a drive circuit coupling said decoder to said display element for driving said display element in response to the output of said decoder, said decoder and said drive circuit being connected to said power source via said power switching means, whereby power supply to said decoder and drive circuit is stopped in response to termination of the output signal from said signal producing means.

9. The device of any one of claims 1, 2, 3, 4 or 8, wherein said counter means comprises a counter responsive to said pulse signal and a memory means coupled to the output of said counter for storing the count of said counter, said memory means being coupled to said display means.

* * * * *